United States Patent [19]
Singer et al.

[11] Patent Number: 5,789,981
[45] Date of Patent: Aug. 4, 1998

[54] HIGH-GAIN OPERATIONAL TRANSCONDUCTANCE AMPLIFIER OFFERING IMPROVED BANDWIDTH

[75] Inventors: Lawrence Singer, Bedford; Todd L. Brooks, Boston, both of Mass.

[73] Assignee: Analog Devices, Inc., Norwood, Mass.

[21] Appl. No.: 638,195

[22] Filed: Apr. 26, 1996

[51] Int. Cl.⁶ .................................................. H03F 3/45
[52] U.S. Cl. ........................... 330/253; 330/257; 330/311
[58] Field of Search ................................. 330/253, 257, 330/260, 294, 311

[56] References Cited

U.S. PATENT DOCUMENTS

| | | | |
|---|---|---|---|
| 4,459,555 | 7/1984 | Jett, Jr. | 330/253 |
| 5,028,881 | 7/1991 | Jackson | 330/253 |
| 5,039,954 | 8/1991 | Bult et al. | 330/311 X |
| 5,155,447 | 10/1992 | Huijsing et al. | 330/260 X |
| 5,434,538 | 7/1995 | Lee et al. | 330/84 |
| 5,442,318 | 8/1995 | Badyal et al. | 330/253 |
| 5,451,909 | 9/1995 | Fattruso | 330/311 |
| 5,469,104 | 11/1995 | Smith et al. | 327/491 |

OTHER PUBLICATIONS

Lloyd, J. et al., "A CMOS Op Amp with Fully–Different Gain–Enhancement", IEEE Transactions on Circuits and Systems–II, Vo. 41, No. 3, Mar. 1994, pp. 241–243.

*Primary Examiner*—James B. Mullins
*Attorney, Agent, or Firm*—Wolf, Greenfield & Sacks, P.C.

[57] ABSTRACT

A high-gain, low-power transconductance amplifier suitable for use in switched-capacitor circuits provides improved accuracy and high-speed operation. The transconductance amplifier includes an input circuit that receives an input voltage. A current mirror circuit is coupled to the input circuit. At least one active cascode circuit, coupled to the current mirror circuit, receives current from the current mirror circuit and provides an output current. The active cascode circuit provides gain enhancement to the transconductance amplifier by increasing the output impedance of the transconductance amplifier.

9 Claims, 7 Drawing Sheets

5,789,981

HIGH-GAIN OPERATIONAL TRANSCONDUCTANCE AMPLIFIER OFFERING IMPROVED BANDWIDTH

FIELD OF THE INVENTION

The present invention generally relates to an operational transconductance amplifier and, more particularly, to a high-speed, high-gain amplifier that consumes relatively little power. The invention specifically is directed to an amplifier having a current mirror circuit and an active cascode gain enhancement circuit.

BACKGROUND OF THE INVENTION

As technological advancement continues in the electronics field, the use of amplifiers in circuits has become prevalent. Many of today's applications require high-speed, highly accurate amplifiers that consume little power. Sampled-data circuits, such as switched-capacitor circuits, often require such high-speed, highly accurate amplifiers. Analog-to-digital converters (ADCs) commonly employ switched-capacitor circuits with such requirements.

To achieve high-resolution, the gain of the amplifier generally must be high. In a single-stage amplifier, such as an amplifier compensated by a capacitive load, the voltage gain of the amplifier is equal to the transconductance of the amplifier multiplied by the output impedance. One way to increase the gain of the amplifier is to increase the output impedance.

Increasing the output impedance can be accomplished by the use of cascode transistors. A single stage amplifier can achieve an overall gain on the order of 1000 by using this technique. A gain of 1000 may be suitable for certain applications. A 12-bit accurate amplifier, however, generally requires a gain within the range of 4,000–40,000. In addition, by using cascodes to increase the output impedance of an amplifier, the headroom (or voltage swing) of the amplifier is reduced as each transistor requires a small voltage drop across it. Thus, when stacking cascodes to achieve amplifier gain enhancement, a balance must be struck between achievable gain and available headroom.

A technique referred to as active cascode gain enhancement was developed in which an internal gain enhancement amplifier is operatively connected to a cascode transistor and is used to boost the output impedance of the overall amplifier by the gain of the internal amplifier. Active cascode gain enhancement is described, for example, in U.S. Pat. No. 5,442,318, titled "Gain Enhancement Technique for Operational Amplifiers", assigned to Hewlett-Packard Corporation. A simple active cascode gain enhancement circuit is shown in FIG. 1. As shown, a cascode current source is formed by transistors M1 and M2. Gain enhancement amplifier 10, having a gain A, is connected in a feedback path between the gate and source nodes of transistor M1. Amplifier 10 increases the output impedance of the cascode current source by a factor of A, as described below.

During operation, if output voltage VOUTN changes, then the voltage at node N will change because transistor M1 has finite gain. Specifically, the voltage change at node N is proportional to the change at node VOUTN divided by the gain of the cascode circuit formed by transistor M1 and amplifier 10. The voltage change at node N produces a corresponding current change in current Iout because transistor M2 has finite output impedance. Amplifier 10 increases the output impedance of the cascode current source by increasing the gain of the cascode circuit such that the voltage at node N remains substantially constant as voltage Vout changes, which activity in turn maintains current Iout substantially constant. As the current Iout changes less when voltage Vout changes, the output impedance increases. The resulting output impedance of the current source approximately is equal to the output impedance of transistor M2 multiplied by the gain of the cascode circuit formed by transistor M1 and amplifier 10.

FIG. 2 is a circuit diagram of a conventional differential amplifier circuit using the active cascode gain enhancement technique, as shown and described in the Hewlett-Packard patent. The amplifier includes an input section 14, including a differential input pair of transistors M3 and M4, and a folded cascode gain stage section 16. The folded cascode gain stage section 16 includes cascode circuits 18 and 20. Each of cascode circuits 18 and 20 includes a gain enhancement amplifier 70 and 60, respectively, for providing active cascode gain enhancement to the respective cascode circuit. Amplifier 60 is a differential amplifier connected between the source and gate nodes of transistors M7 and M8. Similarly, amplifier 70 is a differential amplifier connected between the source and gate nodes of transistors M9 and M10. The gain enhancement amplifiers 60 and 70 operate as described above to increase the output impedance, and thereby the gain, of the amplifier. Such gain enhancement provides high DC gain, yielding high settling accuracy.

Active cascode circuits suffer from a number of drawbacks. In particular, the settling time of the overall amplifier may be dominated by the settling time of the internal gain enhancement amplifiers, requiring the use of internal gain enhancement amplifiers fast enough to suit a particular application. The speed of the internal gain enhancement amplifier 70 is limited by the bandwidth of the cascode transistors M9 and M10 that are in the feedback path of amplifier 70. The bandwidth of cascode transistors M9 and M10 is limited by the parasitic capacitance at nodes 48 and 52. This parasitic capacitance typically is large in the folded cascode structure of FIG. 2.

Another prior art amplifier, as shown in FIG. 3, includes a mirrored transconductance amplifier. Such an amplifier also is aimed at high speed and low power consumption, albeit lower resolution. As shown, the amplifier includes a differential input section 80, a current mirror section 82, a first cascode pair 86, a second cascode pair 84, and a current source 88. The amplifier does not include an active cascode circuit including internal gain enhancement amplifiers, as in the prior art circuits of FIGS. 1 and 2.

Use of the current mirror in the amplifier circuit of FIG. 3 provides certain design flexibility over a folded cascode design. Particularly, the bandwidth of the amplifier can be set fairly independently of the size or bias current of the differential input transistors by altering the mirror ratio of the current mirror circuit. Additionally, the slew rate can be increased by increasing the mirror ratio of the current mirror circuit. Thus, simply by increasing the mirror ratio of the current mirror circuit, the speed of the amplifier can be increased. As one skilled in the art should appreciate, however, increasing the speed of the amplifier generally also increases the power consumption. Thus, a balance must be struck between the settling time and power consumption of the amplifier. The amplifier of FIG. 3 also exhibits the advantage (over the folded cascode design of the prior art design of FIG. 2) that for a given slew rate and bandwidth, it consumes less power. While the amplifier circuit of FIG. 3 does exhibit the above-mentioned advantages, the amplifier is a relatively low gain amplifier.

Accordingly, a general object of the present invention is to provide a fast, high-gain amplifier that consumes relatively little power.

3

SUMMARY OF THE INVENTION

The features and advantages of the present invention will be more readily understood and apparent from the following detailed description of the invention, which should be read in conjunction with the accompanying drawings and from the claims which are appended to the end of the detailed description.

A first embodiment of the invention is directed to a transconductance amplifier. The amplifier includes an input circuit that receives an input voltage. A current mirror circuit is coupled to the input circuit. At least one active cascode circuit, coupled to the current mirror circuit, receives current from the current mirror circuit and provides an output current. The active cascode circuit provides gain enhancement to the transconductance amplifier by increasing the output impedance of the transconductance amplifier.

In one embodiment of the invention, the active cascode circuit is a differential circuit.

In another embodiment of the invention, the active cascode circuit is a single-ended circuit.

Each active cascode circuit includes a cascode transistor and a gain enhancement amplifier coupled to the cascode transistor. In one embodiment, the gain enhancement amplifier is connected across the gate and source terminals of the cascode transistor.

In one embodiment of the invention, each active cascode circuit includes first and second cascode transistors and a differential amplifier coupled to the first and second cascode transistors. In this embodiment, the current mirror circuit includes at least first and second current mirror transistors. The first current mirror transistor provides current to the first cascode transistor and the second current mirror transistor provides current to the second cascode transistor.

In an embodiment of the invention, the active cascode circuit includes a multi-stage amplifier.

In another embodiment of the invention, a method is provided for amplifying an input voltage. The method includes: receiving the input voltage by an input circuit; generating driving current with a current mirror circuit, coupled to the input circuit; providing an output current from the driving current with at least one cascode circuit, coupled to the current mirror circuit; and increasing an output impedance of the active cascode circuit with an internal gain enhancement amplifier.

BRIEF DESCRIPTION OF THE DRAWINGS

For a better understanding of the present invention, reference is made to the accompanying drawings, which are incorporated herein by reference and in which.

4

Figure 7:
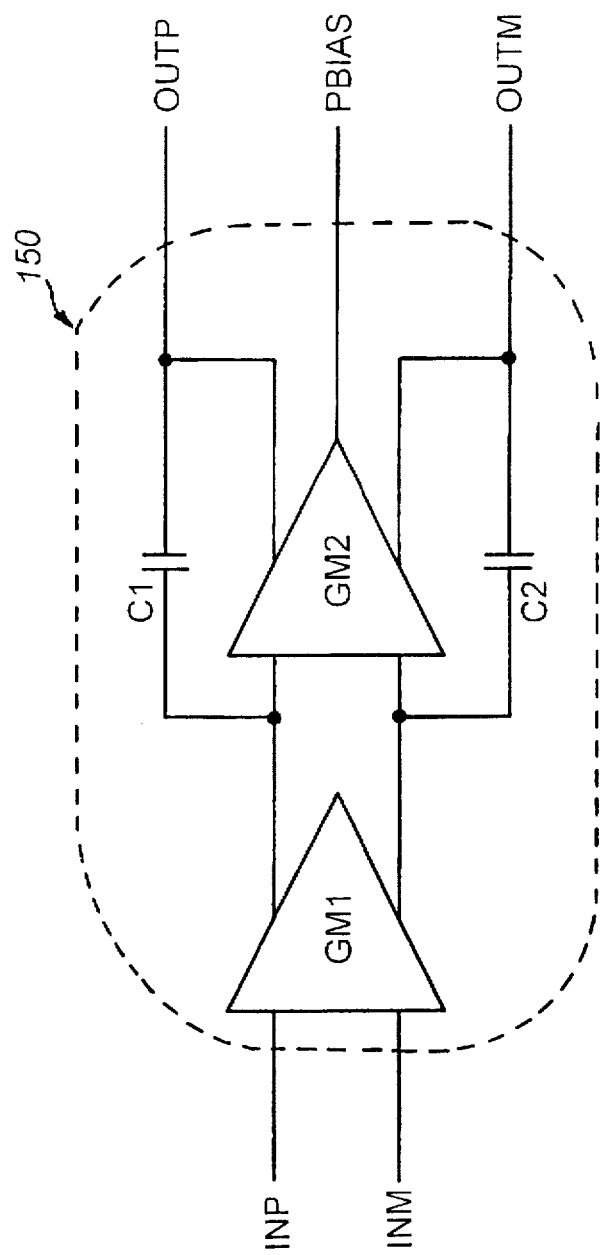

FIG. 7 is a partial schematic, partial block diagram of a differential two-stage implementation of an amplifier according to the present invention.

DETAILED DESCRIPTION

Figure 4:
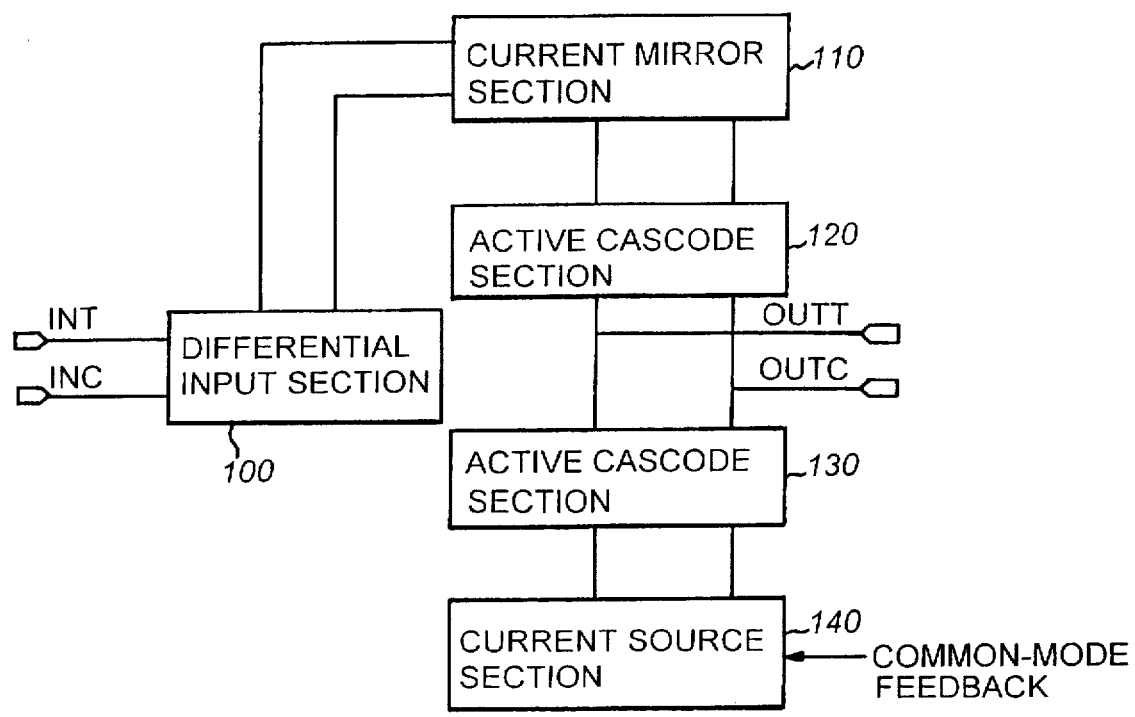
FIG. 4 is a block diagram of a high-speed, high-resolution amplifier circuit according to one embodiment of the present invention.

FIG. 4 is a block diagram illustrating a transconductance amplifier according to one embodiment of the present invention. As shown, the amplifier includes a differential input section 100, a current mirror section 110, a first active cascode section 120, a second active cascode section 130 and a current source section 140. The differential input section 100 receives differential input voltages INT and INC and active cascode sections 120 and 130 provide differential output currents OUTT and OUTC. The invention combines use of current mirror section 110 and active cascode sections 120 and 130 (that provide gain enhancement) yielding a fast, high-resolution, relatively low-power amplifier.

Current mirror section 110 provides the advantages that the transconductance of the overall amplifier can be increased by increasing the mirror ratio. In addition, for any mirror ratio greater then 1, the slew current of the amplifier is greater for the same amount of power when compared to a folded cascode circuit. In addition to the above advantages, the active cascode sections provide gain enhancement to the amplifier such that the output impedance is increased to increase the overall gain of the amplifier.

Figure 5:
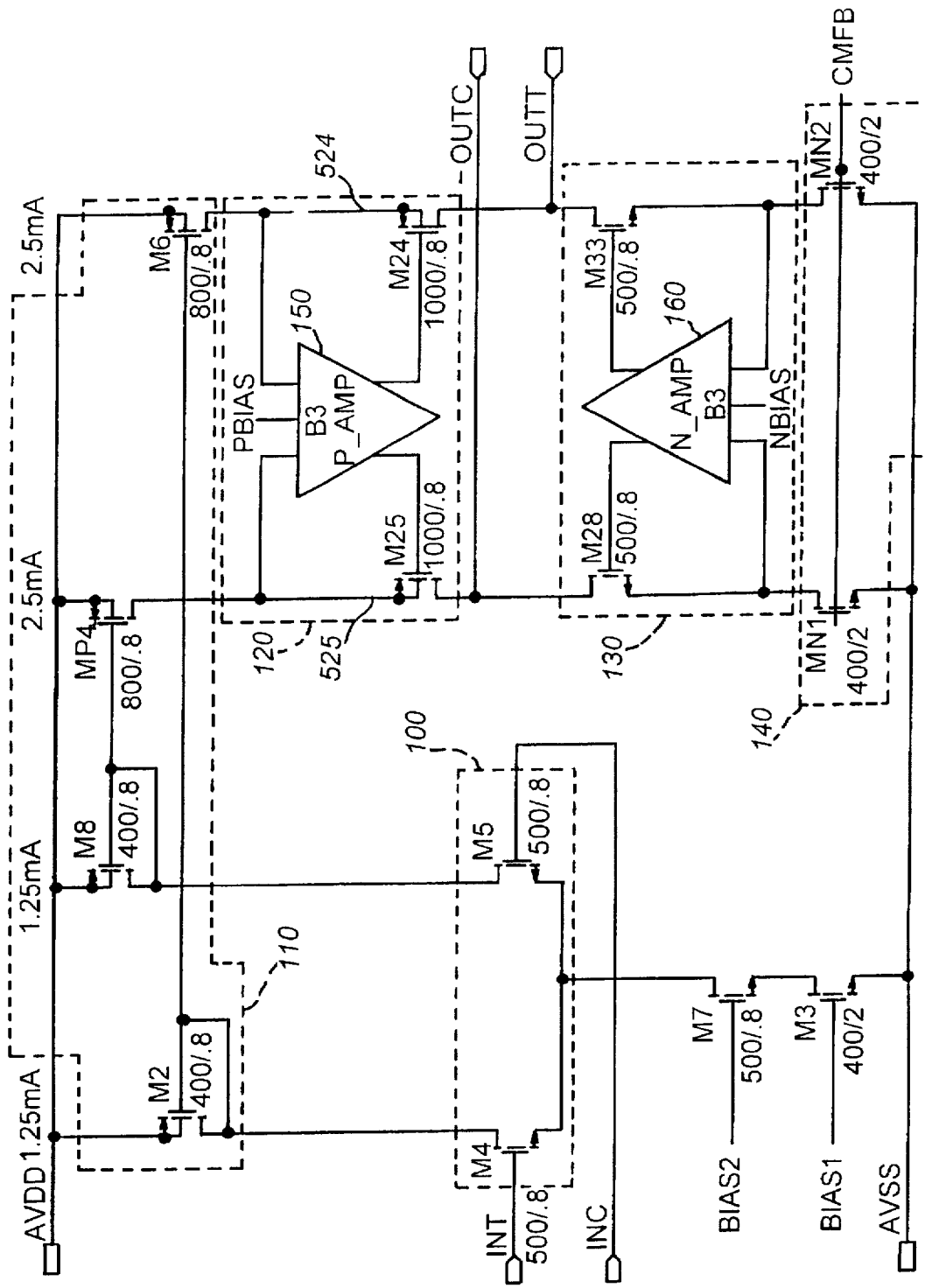
FIG. 5 is a schematic diagram of an exemplary embodiment of the amplifier of FIG. 4.

Shown in FIG. 5 is a schematic diagram of an exemplary embodiment of the differential transconductance amplifier shown in block diagram in FIG. 4. Shown in FIG. 5 are the relative sizes and ratios of the transistors and certain current amplitudes. Such sizes, ratios and amplitudes are intended merely to be exemplary and in no way limiting in scope of protection.

As shown, the circuit includes the differential input pair 100 of transistors M4 and M5. Current mirror section 110 includes transistors M2, MP4, M6 and M8. Active cascode section 120 includes PMOS transistors M24 and M25 as well as differential gain enhancement amplifier 150 connected across the source and gate terminals of transistors M24 and M25. The drain terminal of transistor M25 is connected to one of the output nodes and provides differential output current OUTC. Drain terminal of transistor M24 is connected to another of the differential output nodes and provides differential output current OUTT. Active cascode section 130 includes NMOS transistors M28 and M33 as well as differential gain enhancement amplifier 160 connected across the gate and source terminals of transistors M28 and M33. Current source section 140 includes transistors MN1 and MN2 which receive at their gate terminals a common mode feedback signal CMFB.

Gain enhancement amplifier 150 provides gain enhancement to cascode transistors M24 and M25 and increases the output impedance of active cascode section 120. Similarly, gain enhancement amplifier 160 provides gain enhancement to cascode transistors M28 and M33 and increases the output impedance of active cascode section 130.

Figure 1:
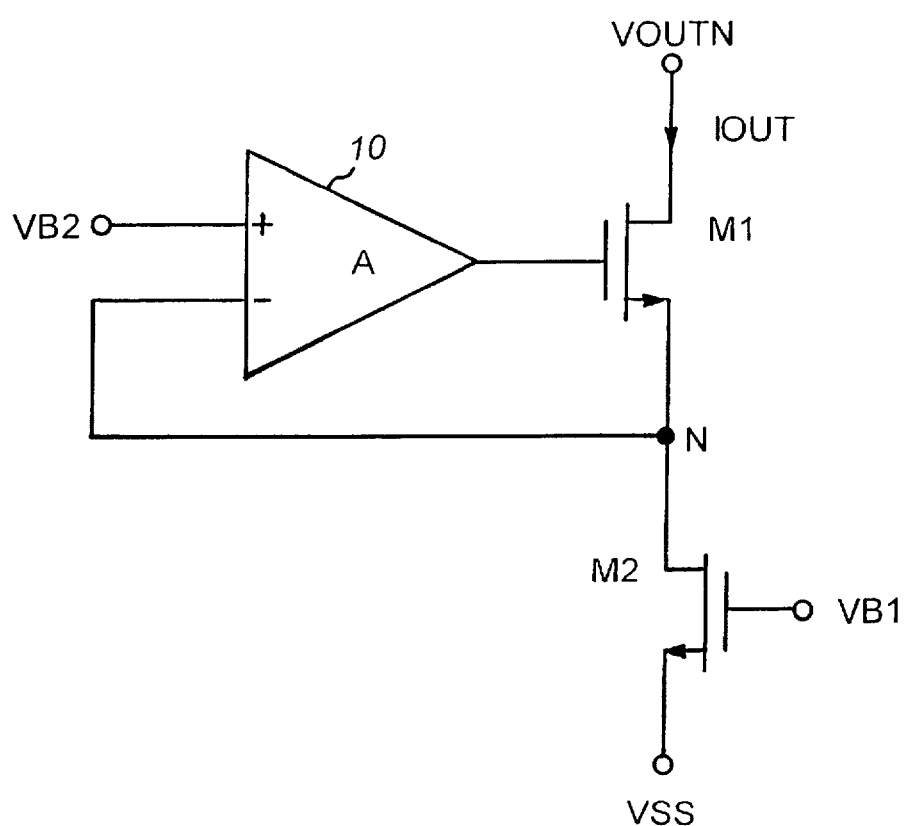
FIG. 1 is a partial block, partial schematic diagram of a prior art active cascode gain enhancement circuit.
Figure 2:
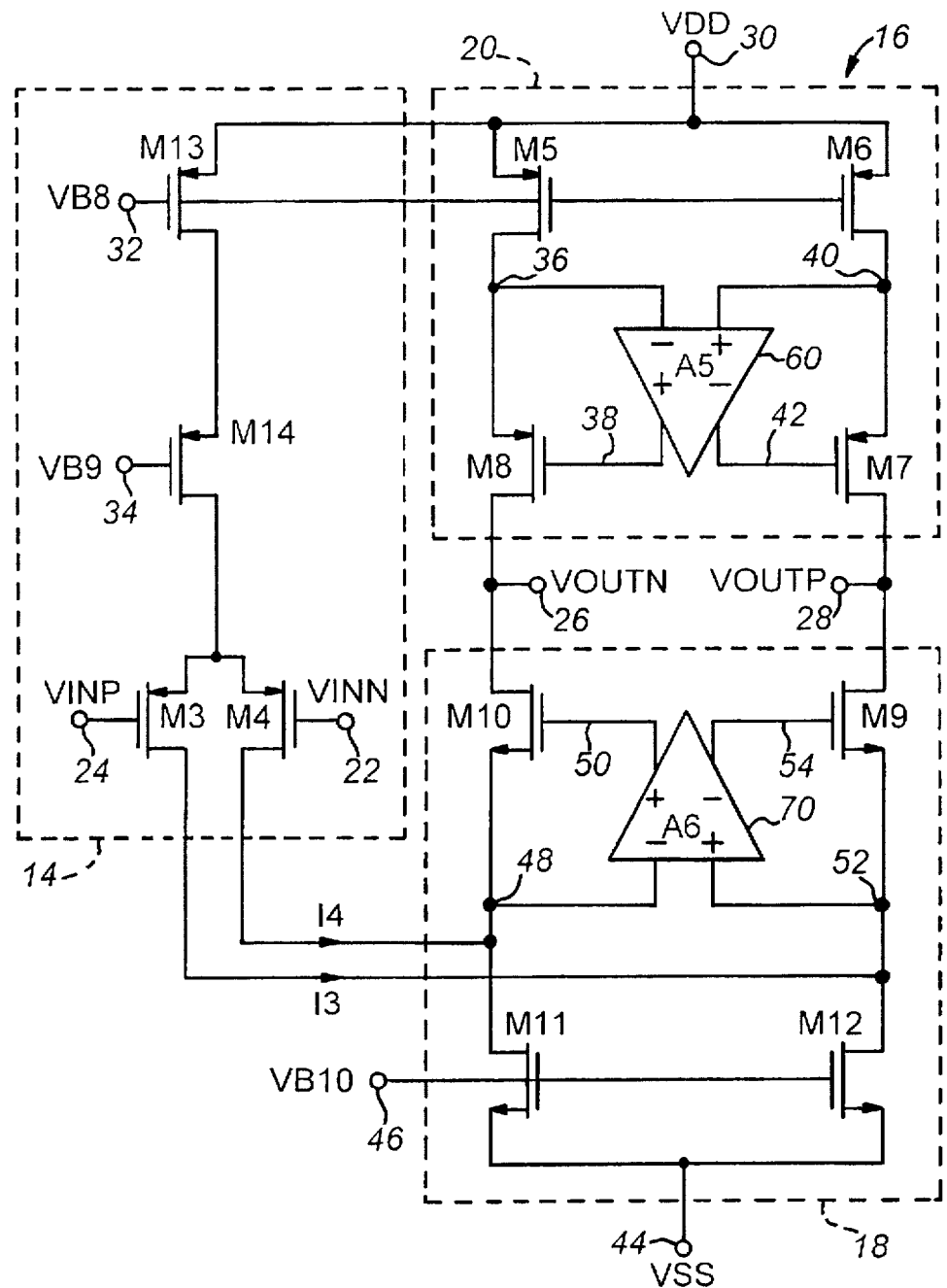
FIG. 2 is a partial block, partial schematic diagram of a differential folded-cascode amplifier circuit that employs active cascode gain enhancement.
Figure 3:
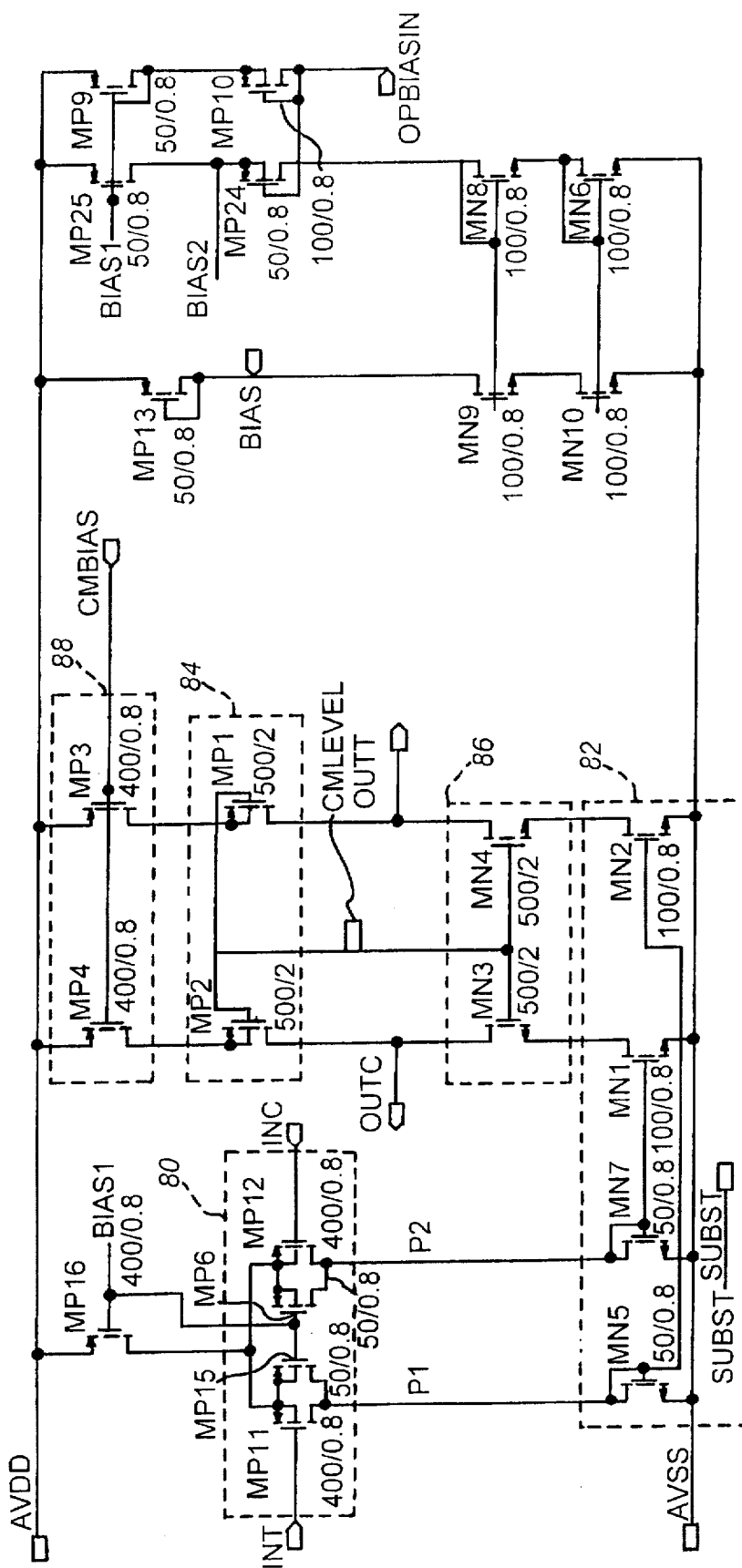
FIG. 3 is a schematic diagram of a prior art mirrored transconductance amplifier circuit.

In addition to providing the gain enhancement advantages discussed above with reference to the circuit of FIG. 2, and the advantages provided by the current mirror circuit discussed above with reference to the circuit of FIG. 3, the circuit of the present invention also provides a distinct advantage over prior art circuits such as that of FIG. 2. Particularly, for amplifiers with comparable output swings and slew capabilities, the parasitic capacitance on the source nodes $S_{24}$ and $S_{25}$ (respectively) of cascode transistors M24 and M25, respectively, of the active cascode circuit 120 can be made less than the parasitic capacitance on the source nodes 48 and 52 of cascode transistors M10 and M9, respectively, of the prior art circuit of FIG. 2. The prior art circuit of FIG. 2 has the drains of input devices M4 and M3, respectively, plus the drains of current source devices M11 and M12, respectively, connected to the source nodes 48 and 52. In the invention of FIG. 5, only the drains of the current mirror devices MP4 and M6, respectively, are connected to source nodes $S_{24}$ and $S_{25}$ (respectively) of cascode transistors M25 and M24. In addition, for amplifiers with comparable output swings and slew capabilities, the current sources in the current mirror section 110 of the circuit of FIG. 5, including transistors MP4 and M6, which respectively provide current to transistors M25 and M24 of active cascode circuit 120, are smaller than the current source transistors M11 and M12 of the prior art circuit of FIG. 2. This is so because transistors MP4 and M6 provide current only to the active cascode sections of the circuit of FIG. 5 whereas transistors M11 and M12 of the prior art circuit of FIG. 2 provide current both to the active cascode sections and to the differential input section. The decrease in the parasitic capacitance on the source nodes of the cascode transistors of the present invention increases the bandwidth of the cascode transistors M24 and M25 and thereby allows the active cascode amplifier 150 to achieve higher speed. It should be appreciated that amplifier 150 within active cascode section 120 must be much faster than the overall amplifier to avoid degrading the settling time of the overall amplifier.

When the amplifier is used in a sampled-data system such as a switched-capacitor circuit, the amplifier is typically required to slew at the beginning of each clock period. Thus, the active cascode section 120 receives a large differential current at the beginning of each clock period which results in a large differential voltage at the sources of cascode transistors M24 and M25. Thus, at the beginning of each clock period, the differential voltage between the sources of the cascode transistors rapidly changes, while the differential voltage between the gates of the cascode transistors remains initially constant. The gain enhancement amplifier 150 then begins slewing rapidly and overshoots the point to which it eventually settles. When the overall amplifier stops slewing, the gain enhancement amplifier must rapidly recover from this overshoot condition in order to avoid degrading the settling time of the overall amplifier. One solution, as mentioned, is to employ an internal amplifier that is fast enough to meet the requirements of a particular application. Another approach would be to employ a capacitor across the output terminals of the internal gain enhancement amplifier.

An alternative approach to that shown and described would be to use a two-stage amplifier as the amplifier 150, that may provide better accuracy and overshoot recovery performance.

An alternative approach to that shown and described which substantially avoids the overshoot recover problem is to use a two-stage Miller-compensated amplifier as the amplifier 150. Shown in FIG. 7 is a partial schematic, partial block diagram of a differential of a differential two-stage implementation of amplifier 150 that utilizes first differential transconductance amplifier GM1, second differential transconductance amplifier GM2, and Miller capacitors, C1 and C2, for compensation. Miller capacitors C1 and C2 provide feedback around the second stage transconductance amplifier GM2. If the transconductance of GM2 is large, then the second stage provides a low output impedance between the gates of cascode transistors M24 and M25 of FIG. 5. Thus, when the overall amplifier slews and a large differential voltage appears between the source nodes of cascode transistors M25 and M25, the low output impedance of second transconductance stage GM2 provides current to charge the gate-to-source capacitance of M24 and M25 without appreciably changing the differential voltage across the gates of the cascode transistors.

Moreover, If the slew capacity of the first transconductance amplifier GM1 is small, then the amplifier 150 can not respond rapidly to the large differential voltage that appears between the source nodes of cascode transistors M24 and M25 (which are connected to the inputs INP and INM of the amplifier 150 in FIG. 7). This in turn prevents the amplifier 150 from significantly overshooting its final value, and so the recover time is shortened substantially. Furthermore, a two-stage amplifier has higher gain than a single-stage amplifier, and therefore increases the gain of the active cascode circuit 120 by this additional amount. This in turn increases the gain of the overall differential transconductance amplifier of FIG. 5, thus making it useful in applications requiring higher accuracy. It should be appreciated that although FIG. 7 illustrates a differential two-stage implementation of active cascode amplifier 150, single-ended, two-stage amplifiers may be used for the same advantages.

Figure 6:
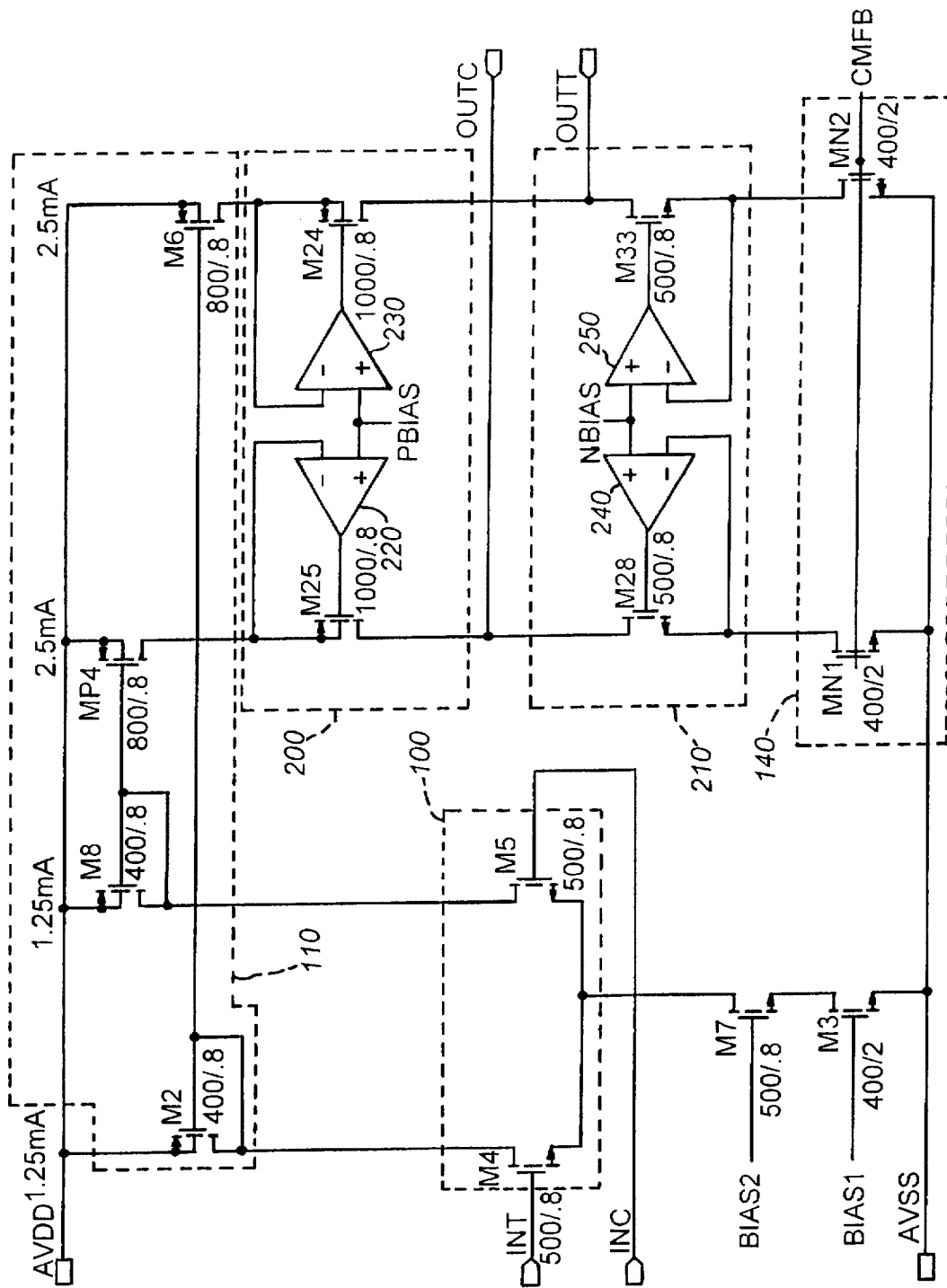
FIG. 6 is a schematic diagram of an embodiment of the amplifier of FIG. 4 including single-ended active cascode circuits.

Shown in FIG. 6 is a schematic diagram of an exemplary embodiment of the transconductance amplifier shown in block diagram in FIG. 4. Same reference characters are used in FIG. 6 as are used in FIG. 5 to denote similar elements. Unlike the embodiment shown in FIG. 5, the circuit of FIG. 6 includes active cascode sections 200 and 210 which include single-ended gain enhancement amplifiers.

Active cascode section 200 includes single-ended gain enhancement amplifiers 220 and 230. The output of gain enhancement amplifier 220 is connected to the gate terminal of transistor M25, the inverting input of gain enhancement amplifier 220 is connected to the source terminal of transistor M25 and the non-inverting input of amplifier 220 receives a bias voltage PBIAS. Gain enhancement amplifier 230 similarly is connected with respect to transistor M24.

Active cascode circuit 210 includes single-ended gain enhancement amplifiers 240 and 250. Amplifier 240 similarly is connected with respect to NMOS transistor M28 as is amplifier 220 with respect to PMOS transistor M25, described above. Amplifier 240 receives a bias voltage NBIAS at its non-inverting input. Gain enhancement amplifier 250 similarly is connected with respect to NMOS transistor M33.

Gain enhancement amplifier 220 provides gain enhancement to cascode transistor M25. Gain enhancement amplifier 230 provides gain enhancement to cascode transistor M24. Gain enhancement amplifier 240 provides gain enhancement to cascode transistor M28. Gain enhancement 250 provides gain enhancement to cascode transistor M33.

It should be understood that while the amplifier circuit of the present invention was shown and described as a differential circuit, it alternatively could be a single-ended circuit. Similarly, while certain of the amplifier circuits were shown and described as PMOS circuits and other of the amplifier circuits were shown and described as NMOS circuits, the descriptions were exemplary and the doping of such elements could be interchanged to suit a particular application.

In addition, the input circuits, current mirror circuits and cascode circuits shown and described were exemplary. Any input circuit or current mirror circuit could be used with the invention. Also, any number of current mirror circuits or cascode circuits (such as stacked cascode transistors) could be used with the invention.

Having thus described at least one illustrative embodiment of the invention, various alterations, modifications and improvements will readily occur to those skilled in the art. Such alterations, modifications and improvements are intended to be within the spirit and scope of the invention. Accordingly, the foregoing description is by way of example only and is not intended as limiting. The invention is limited only as defined in the following claims and the equivalents thereto.

What is claimed is:

1. A transconductance amplifier comprising:

at least one input circuit that receives an input voltage;

at least one current mirror circuit, coupled to the at least one input circuit; and at least one active cascode circuit, coupled to the at least one current mirror circuit, that receives current from the current mirror circuit and provides an output current;

wherein the at least one active cascode circuit includes an internal gain enhancement amplifier that increases an output impedance of the active cascode circuit.

2. The transconductance amplifier as claimed in claim 1 wherein the at least one active cascode circuit includes a differential circuit.

3. The transconductance amplifier as claimed in claim 1 wherein the at least one active cascode circuit includes a single-ended active cascode circuit.

4. The transconductance amplifier as claim in claim 1 wherein the gain enhancement amplifier is connected across gate and source terminals of a cascode transistor included in the active cascode circuit.

5. The transconductance amplifier as claimed in claim 1 wherein each active cascode circuit further includes first and second cascode transistors coupled to the gain enhancement amplifier.

6. The transconductance amplifier as claimed in claim 5 wherein the current mirror circuit includes at least first and second current mirror transistors, and wherein the first current mirror transistor provides current to the first cascode transistor and the second current mirror transistor provides current to the second cascode transistor.

7. The transconductance amplifier as claimed in claim 1 wherein the active cascode circuit includes a multi-stage amplifier.

8. The transconductance amplifier as claimed in claim 7 wherein the gain enhancement amplifier includes a two-stage amplifier having a compensating capacitor connected in a feedback arrangement to a second stage of the two-stage amplifier.

9. A method for amplifying an input voltage comprising steps of:

receiving the input voltage by an input circuit;

generating a driving current with a current mirror circuit coupled to the input circuit;

providing an output current from the driving current with an at least one active cascode circuit coupled to the current mirror circuit; and increasing an output impedance of the active cascode circuit with an internal gain enhancement amplifier.

* * * * *

UNITED STATES PATENT AND TRADEMARK OFFICE
CERTIFICATE OF CORRECTION

PATENT NO. : 5,789,981
DATED : August 4, 1998
INVENTOR(S) : Lawrence Singer and Todd L. Brooks It is certified that error appears in the above-identified patent and that said Letters Patent is hereby corrected as shown below:

Column 7, line 28, please replace "claim" with --claimed--.

Column 8, line 12, please replace "active cascode circuit" with --gain enhancement amplifier--.

Column 8, line 15, please replace "gain enhancement amplifier" with --active cascode circuit--.

Signed and Sealed this

Sixteenth Day of March, 1999

Attest:

Q. TODD DICKINSON

*Attesting Officer*    *Acting Commissioner of Patents and Trademarks*